United States Patent [19]

Ito et al.

[11] Patent Number: 4,512,642
[45] Date of Patent: Apr. 23, 1985

[54] AUTOMATIC FOCUSING APPARATUS IN OPTICAL DRAWING MACHINE

[75] Inventors: Tokuhisa Ito, Tokyo; Hideaki Ohno, Sakadoshi; Izumi Kurata, Tokyo; Takashi Okuyama, Urawashi, all of Japan

[73] Assignee: Ashai Kogaku Kogyo Kabushiki Kaisha, Tokyo, Japan

[21] Appl. No.: 418,567

[22] Filed: Sep. 15, 1982

[30] Foreign Application Priority Data

Sep. 18, 1981 [JP] Japan .................. 56-147243

[51] Int. Cl.³ .................. G03B 41/00; G01J 1/20
[52] U.S. Cl. .................. 354/4; 354/400; 354/402; 354/406; 250/201
[58] Field of Search .......... 354/4, 5, 400, 402, 354/406–408; 352/140; 250/201; 369/45, 112

[56] References Cited

U.S. PATENT DOCUMENTS

| | | | |
|---|---|---|---|
| 3,969,575 | 7/1976 | Gerritsen et al. | 369/45 |
| 3,969,576 | 7/1976 | Boonstra et al. | 369/45 |
| 3,984,845 | 10/1976 | Tashiro et al. | 354/4 |
| 4,132,888 | 1/1979 | Kondo | 250/201 X |
| 4,376,303 | 3/1983 | Lurie | 369/112 X |
| 4,383,757 | 5/1983 | Phillips | 250/201 X |

Primary Examiner—L. T. Hix
Assistant Examiner—D. Rutledge
Attorney, Agent, or Firm—Merchant, Gould, Smith, Edell, Welter & Schmidt

[57] ABSTRACT

Automatic focusing apparatus in an optical drawing machine, comprising a drawing optical means having a dichroic mirror which transmits light for drawing and reflects light for detecting the focus to apply the focus detecting light to which a photosensitive material is insensitive onto the latter, an imaging lens means, and a focus detecting device for detecting whether the surfaces of the photosensitive material are located in the depth of focus of the drawing optical means.

3 Claims, 14 Drawing Figures

AUTOMATIC FOCUSING APPARATUS IN OPTICAL DRAWING MACHINE

This invention relates to an automatic optical drawing machine for drawing a predetermined pattern of precision optical images on a photosensitive material, and more particularly to an automatic focusing apparatus and method in such an optical drawing machine.

In order to draw a precision optical image on a photosensitive material, it is necessary to continuously put a sensive surface of the photosensitive material in a depth of focus of imaging lens assembly. However, as is well known, the depth of focus decreases as a resolving power of the imaging lens assembly increases. The resolving power must be increased to increase precision of an optical image and a pattern to be drawn.

A relationship between a resolving power and a depth of focus, of a lens will be described below in brief.

In order to increase the resolving power of a lens, it is necessary to increase numerical aperture (N.A.) of the lens. As is well known, a theoretical resolution limit of an ideal lens is determined by a spatial cut-off frequency $(\nu_c)$ when OTF(optical transfer function) is zero. The spatial cut-off frequency $(\nu_c)$ is given by the following equation;

$$\nu_c = 2 (N.A.)/\lambda$$

wherein $\lambda$ is a wavelength of light used.

As can be seen from the above equation, N.A. must be increased to increase $\nu_c$, and, accordingly, the resolving power, when $\lambda$ is constant.

On the other hand, the depth $(\Delta)$ of focus is given by the following equation;

$$\Delta = \lambda/[2 (N.A.)^2]$$

As can be seen from this equation, when N.A. is increased, $\Delta$ is decreased. It should be noted that the resolving power varies in proportion to N.A. as a linear function and that the depth of focus varies in inverse proportion to the square of N.A.. Therefore, it is inevitable that the depth of focus becomes small to make a precision of an optical image higher and to obtain clear and sharp edges of a profile of an optical image.

Figure 1A:
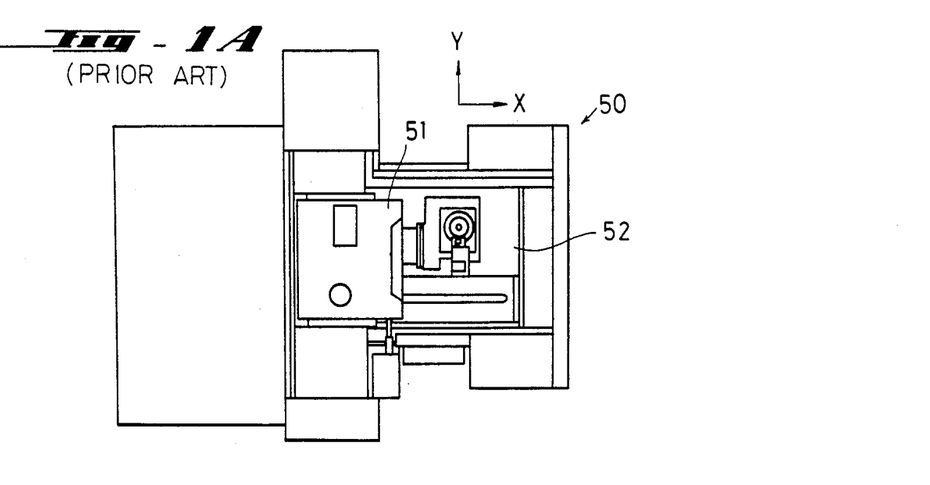
FIGS. 1A, 1B and 1C are plan view, right side elevational view, and front elevational view of an optical drawing machine, according to prior art, respectively.
Figure 1B:
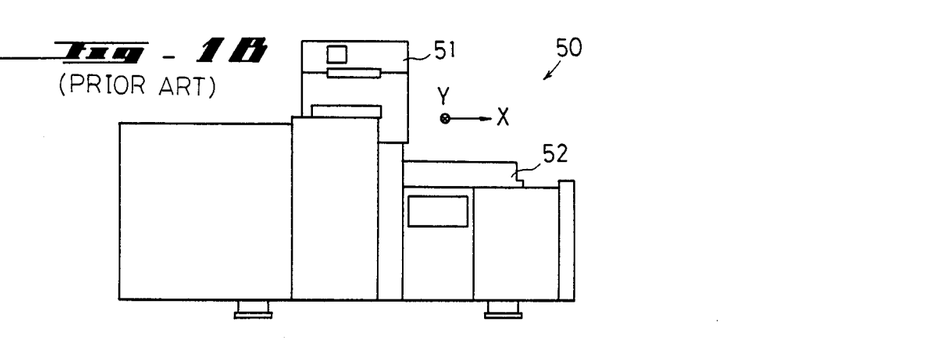
Figure 1C:
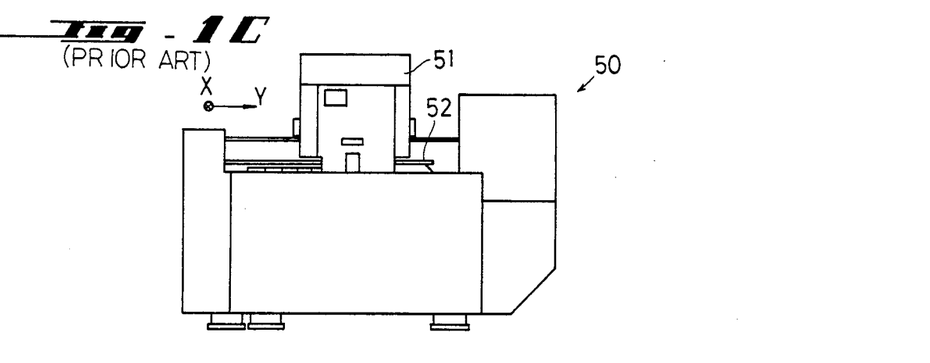

An optical drawing machine of prior art is shown in FIGS. 1A through 1C. The machine 50 has a drawing optical means on a photohead 51 and a drawing table 52 carrying a photosensive material thereon. The drawing table 52 is located so that it is perpendicular to an optical axis of the optical means. A relative two-dimentional movement occurs in the plane of the drawing table 52, between the photohead 51 and the drawing table 52. In the illustrated arrangement, the drawing table 52 moves in X-axis and the photohead 51 moves in Y-axis. The drawing table 52 and the photohead 51 move in the respective directions mentioned above in accordance with output signals of a numerical control device to automatically draw an optical image on the photosensive material. However, in the optical drawing machine of prior art, two problems must be solved in order to form an optical image on the photosensitive material located on the drawing table 52 within the depth of focus of the drawing optical means of the photohead 51. The first problem is that it is very difficult to ensure a surface flatness of the photosensitive material ( a glass dry plate is usually used as the photosensitive material ). The second problem is an occurrence of dimensional errors of the position of the photosensitive material relative to the optical means, in the direction of the depth of focus due to rolling or pitching of movable parts of the machine, accidental displacements of the drawing table or mechanical deformation of frames of the machine.

Figure 2:
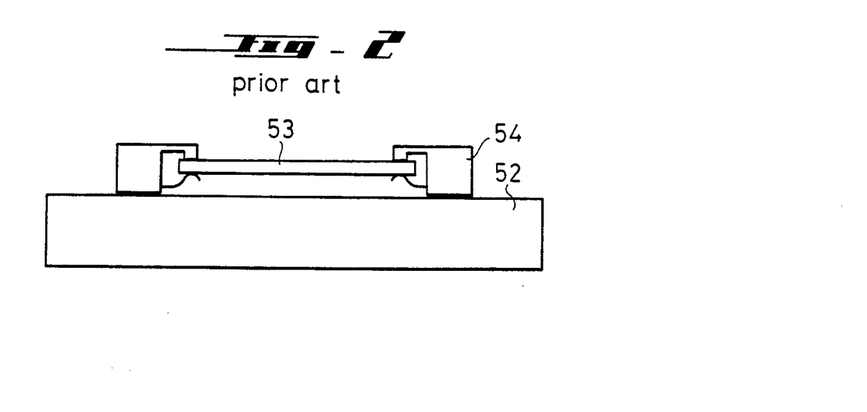
FIG. 2 is a sectional view of a holder of a photosensitive material in a conventional optical drawing machine.

In order to solve the first problem, it is known to suck the photosensitive material onto the drawing table by means of vacuum suction. However, in this way of vacuum suction, no clear image can be expected to be drawn, when the depth of focus is small. It is also known to provide a supporting block 54 on the drawing table 54 on the drawing table 52 for supporting the photosensitive material 53 so that the surface of the photosensitive material 53 is parallel to the surface of the drawing table 52, as shown in FIG. 2, thereby to keep the surface of the photosensitive material within the depth of focus. However, the supporting block can compensate only for the failure of the provision of parallel front and rear side surfaces of the photosensitive material and cannot compensate for errors in flatness of the surfaces, due to warp or curvature of the surfaces of the like. The errors in flatness of the surface becomes large when the photosensitive material has a large size.

The second problem cannot be solved by devices of prior art, and, accordingly, no highly precision pattern of optical image can be obtained.

The primary object of the present invention is, therefore, to solve the above-mentioned problems by displacing the drawing optical means in the directions of the optical axis, following the uneven surfaces of the photosensitive material, so as to draw an optical image within the depth of focus, without the provision of supports for maintaining the flatness of the surfaces of the photosensitive material.

According to the present invention, there is provided an automatic focusing apparatus in which the location of the surfaces of the photosensitive material is continuously detected during the two-dimentional relative movement of the photohead and the drawing table to detect whether or not the surfaces of the photosensitive material are put within the depth of focus of the drawing optical means, and the focus of the drawing optical means is displaced in the directions of the optical axis, if necessary, in accordance with detection signals so that the surfaces of the photosensitive material are always in the depth of focus.

According to the present invention, there is provided an apparatus for effecting the method as mentioned above, comprising an inclined dichroic mirror in the drawing optical means which transmits light for drawing and reflects light for detecting the focus to apply the focus detecting light to which the photosensitive material is insensitive onto the latter, an imaging lens assembly of the dichroic mirror and the drawing optical means, and a focus detecting device for detecting whether the surfaces of the photosensitive material are located in the depth of focus of the drawing optical means, by the reflecting light of the focus detecting light, whereby an actuator operates in response to signals from the focus detecting device to displace the drawing optical means in the directions of the optical axis.

The invention will be discussed below in detail with reference to the accompanying drawings, in which.

Figure 3:
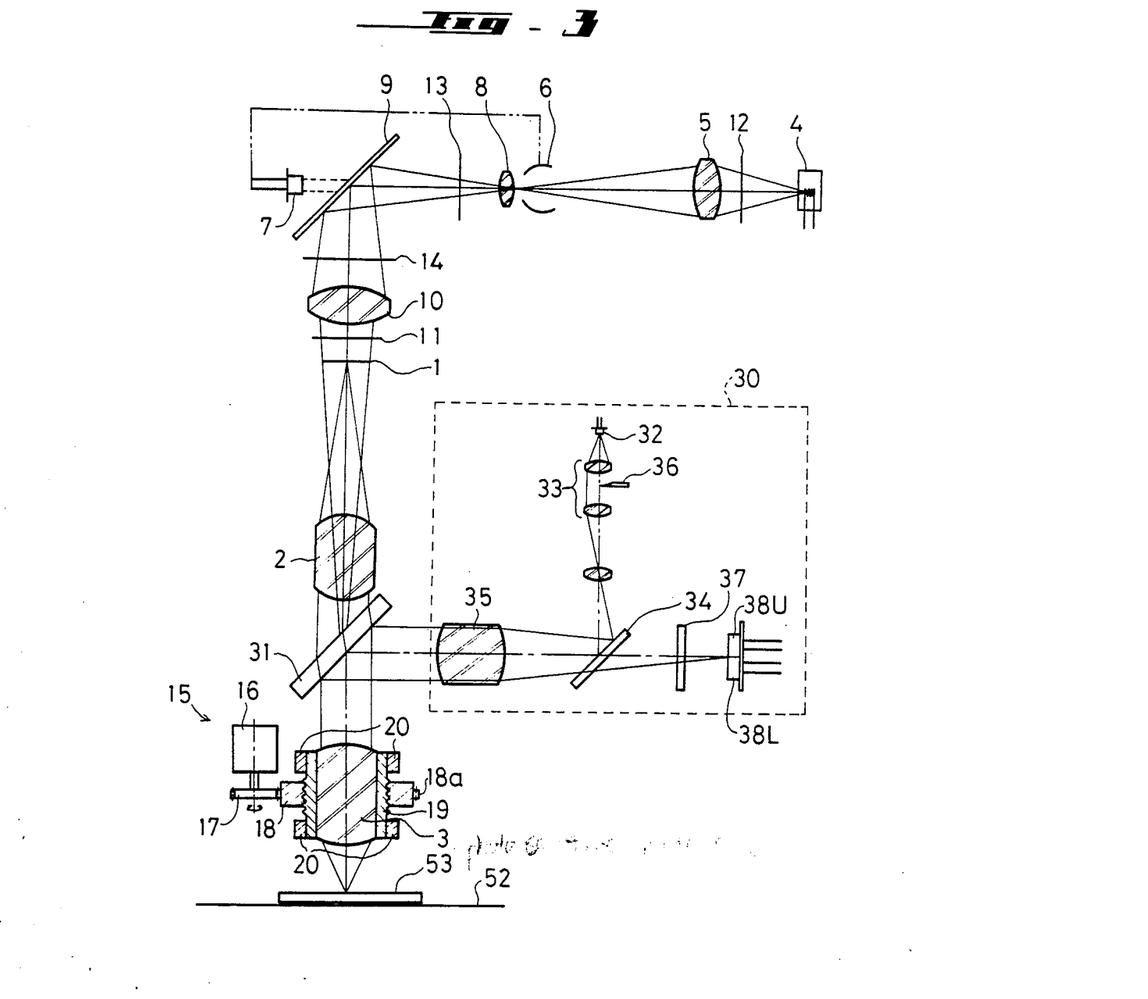
FIG. 3 is a schematic view of an optical system in an optical drawing machine according to the present invention.

FIG. 3 shows a concept of the optical system according to the present invention, for example, provided in the photohead 51 of the optical automatic drawing machine 50 shown in FIG. 1. In FIG. 3, the numeral 1 designate a member usually called an aperture. An optical image of the aperture is formed on the photosensitive material 53 of the drawing table 52 by means of drawing optical means consisting of a collimate lens (assembly) 2 and an imaging lens (assembly) 3. The collimate lens 2 forms an image of the aperture 1 at an afocal distance so that beams from the collimate lens 2 are parallel beams. The parallel beams are focused on the photosensitive material 53 by means of the drawing optical means. In order to adjust the focus of the lens means it is necessary only to move the imaging lens 3 in the directions of optical axis thereof without changing a magnification of the imaging lens 3. Further more, the dichroic mirror 31 can be arranged at any place between the collimate lens 2 and the imaging lens 3 to effect the the reception and feed of the focus detecting light between the focus detecting device 30 and the photosensitive material 53.

A halogen lamp 4 is used as a light source of the aperture 1. A filament image of the lamp is diaphragmed by a first condenser lens (assembly) 5 to make an image at a diaphragming shutter 6. The shutter 6 increases or decreases the amount of light as a function of drawing speed to maintain a constant exposure of the photosensitive material with respect to the drawing speed and to control the amount of light. The change of the amount of light is detected by an exposure controlling light receiving element 7 and the detection signal is fed back to the shutter 6 so that a closed loop of control system is provided (e.g. the applicant's copending Japanese Patent public disclosure Nos. 50-72721 and 55-71592 which give details of an optical system including such a shutter). An exit pupil of the first condenser lens 5 is imaged on the aperture 1 by means of a relay condenser lens (assembly) 8, a half mirror 9 and a second condenser lens (assembly) 10, so that the aperture 1 is uniformly illuminated. The second condenser lens 10 makes a filament image of the light source (halogen lamp) 4 which has been imaged at the shutter 6, on a pupil of the collimate lens 2 so that a lumimous flux illuminating the aperture 1 come into the collimate lens 2. The half mirror has a large reflection factor and a small transmission factor, so that it reflects a large part of luminous flux and turns same at right angle. On the other hand, the remaining luminous flux passing through the half mirror is received by the light receiving element 7. In an optical illumination system shown in FIG. 3 is also provided a Neutral Density filter (ND filter) 11 which is incorporated in a holder of the aperture 1. ND filters 11 having different transmission factors are selectively attached to the aperture holder, in accordance with diameters of the aperture 1 to provide a constant exposure. The numeral 12 designates a filter which reflects only infrared radiation having a predetermined range of wavelength and absorbs infrared radiation having wavelength out of the range, so that infrared radiation from the halogen lamp 4 does not come to the photosensitive material 53, which otherwise would give an noise to the infrared focus detecting light from the focus detecting device 30. Similarly, there are provided wavelength selection filter 13 and ND filter 14 to absorb undesirable infrared rays having wavelength harmful to the photosensitive material.

The dichroic mirror 31 has a glass plate with parallel flat surfaces which transmits the light for drawing from the halogen lamp 4 and which reflects, at its back surface, the focus detecting light (which is infrared light in the illustrated embodiment). The dichroic mirror (plane mirror) 31 is inclined at of 45° with respect to the optical axis of the collimate lens 2, in parallel flux between the lens 2 and the imaging lens 3. The focus detecting device 30 has a light-emitting element such as LED 32 which emits infrared rays for the focus detecting light. This is because the photosensitive material which is usually used in an optical drawing machine is not sensitive to the infrared radiations. The focus detecting light emitted from the LED 32 is collected by the condenser lens assembly 33, passes through an inclined half mirror 34, and comes to a collimate lens (assembly) 35 which makes a parallel light flux. The condenser lens assembly 33 has therein a knife-edge 36 which is adapted to obstruct half of the flux or more than half of the flux to form a generally semi-circular flux. Thus obtained semi-circular flux (incident light) is reflected by the dichroic mirror 31 at right angle and reaches the imaging lens 3. After that, the focus detecting light reaches the surface of the photosensitive material 53 and reflects thereon. When the surface of the photosensitive material is accurately located at the focus point of the drawing optical system, the focus detecting light reflected by the surface of the photosensitive material 53 passes again through the imaging lens 3 and is converted to a parallel flux. The reflected parallel flux is of a generally semi-circular so that it defines a circle together with a semi-circle of the incident light flux. The reflected flux is then reflected by the dichroic mirror 31 at right angle, passes through the collimate lens 35, the half mirror 34 and a visible radiation absorbing filter 37 which transmits infrared radiations and which absorbs the visible radiations, and comes to a pair of upper and lower separate light receiving elements 38U and 38L which are located at a focal point of the collimate lens 35. The focal point of collimate lens 35 defines a conjugate image surface of a complete focus position of the photosensitive material.

The amounts of reflected rays of the focus detecting light which are received by the light receiving elements 38U and 38L, respectively, are identical to each other (and can be zero), when the surface of the photosensitive material 53 is located at the focal point of the drawing optical system. Namely, the two light receiving elements 38U and 38L are positioned so that there is no difference in the amount of light received by the light receiving elements 38U and 38L when the surface of the photosensitive material is located at the focal point of the drawing optical system.

Figure 4:
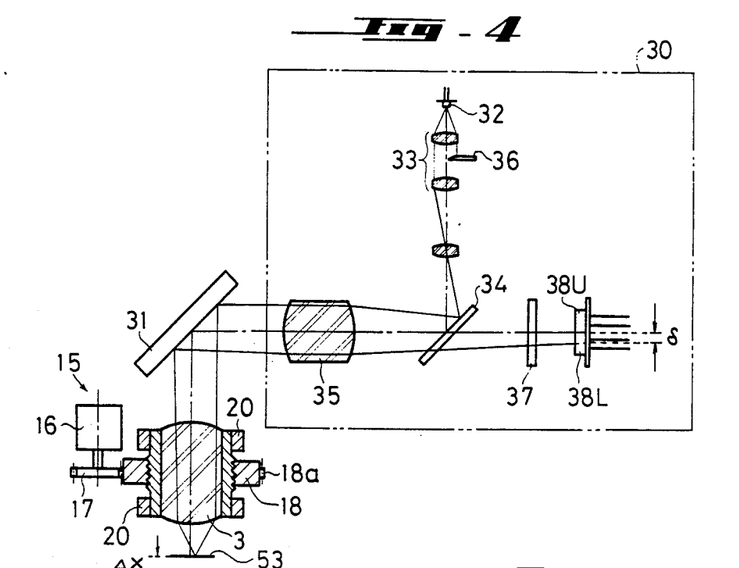
FIGS. 4 and 5 are schematical views of the optical system illustrated in FIG. 3, shown at a front focus state and at a rear focus state, respectively.

However, in case of a "front focus" position shown in FIG. 4 in which the surface of the photosensitive material 53 is not located at the focal point but is adjacent and closer to the lens 3 than the focal point, by an offset value $\Delta X$, the focus detecting light reflected from the photosensitive material 53 does not equally fall on the two light receiving elements, so that the amount of light received by the lower element 38L is larger than that received by the upper element 38U.

Figure 5:
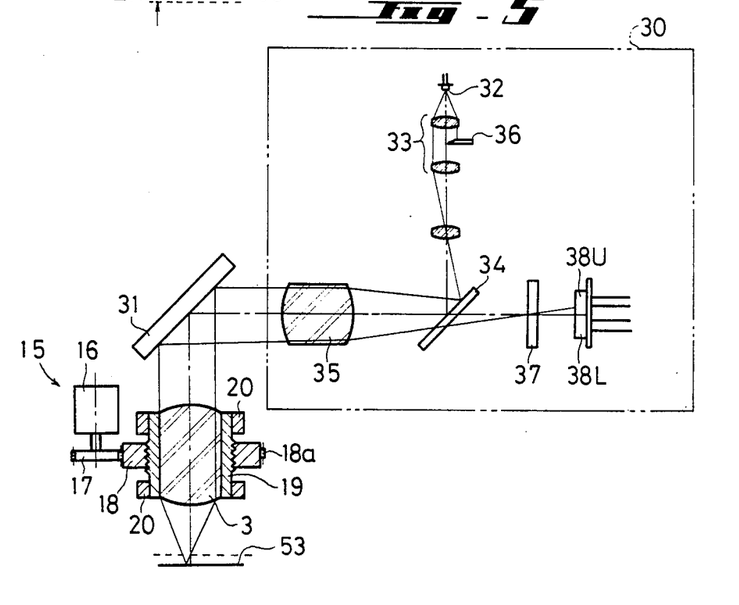

On the contrary, in case of a "rear focus" position shown in FIG. 5 in which the surface of the photosensitive material 53 is located farther from the lens 3 than the focal point of the lens 3, the amount of light received by the upper element 38U is larger than that received by the lower element 38L.

An actuator 15 for moving the imaging lens 3 in directions of its optical axis controls the axial position of the imaging lens 3 so that the difference in outputs between the two elements 38U and 38L is zero or within an allowable limit, thereby to continuously put the surface of the photosensitive material 53 within the depth of focus of the drawing optical system. The actuator 15 has a reversible motor 16, a pinion 17 connected to a drive shaft of the motor 16, and a rotatable ring 18 which is provided, on its outer periphery, with a gear 18a meshing with the pinion 17 and which is provided, on its inner periphery, with a lens barrel 19 of the imaging lens 3 screwed in the ring 18. The rotatable ring 18 cannot move in the optical axis direction. When the motor 16 rotates or reverses, the imaging lens 3 is moved in the optical axis directions along tubular guides 20 in which the lens barrel 19 is fitted.

Figure 6:
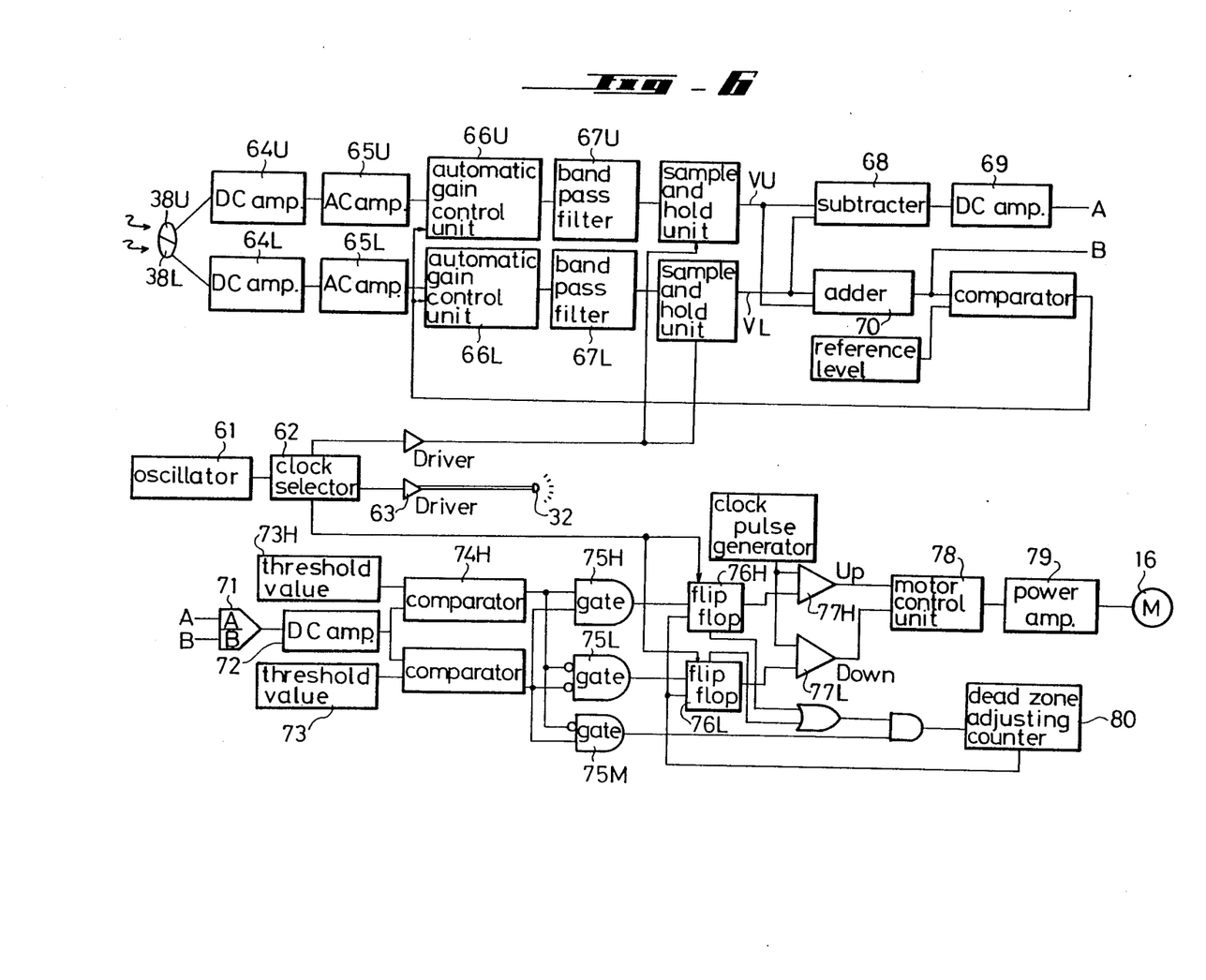
FIG. 6 is a block diagram including a logic circuit for operating an actuator of displacing the drawing optical means in the directions of the optical axis in accordance with the location of the focus point.
Figure 7:
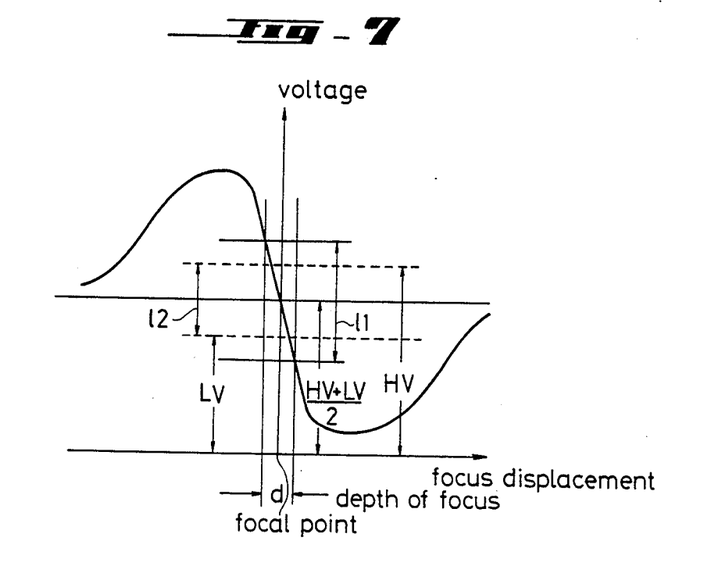
FIG. 7 is a diagram showing a relationship between the displacement of focus and a potential level (voltage), obtained by an arithmetic process of outputs of a pair of light receiving elements which receive a flux of focus detecting light.

FIG. 6 shows an electrical control system for driving and reversing the motor 16, in accordance with the difference in the amount of light between the light receiving units 38U and 38L. In FIG. 6, LED 32 transmits light at a reference frequency, through an oscillator 61, a clock selector 62 and a driver 63. The light emitted from LED 32 comes to and reflects on the surface of the photosensitive material 53 through the above mentioned focus detecting optical system. The reflecting light passes through the same focus detecting optical system and then the half mirror 34 and comes to the light receiving elements 38U and 38L. The light receiving elements 38U and 38L issue output signals representing the amount of light received by the elements 38U and 38L. The output signals of the elements 38U and 38L are amplified by means of DC amplifiers 64U and 64L and AC amplifiers 65U and 65L, respectively. Amplittudes of the amplified outputs are controlled by means of automatic gain control units 66U and 66L, respectively. Band pass filters 67U and 67L allow to pass only output signals having a predetermined band of frequencies. The output signals are then processed by respective sample and hold units. The outputs thus processed are represented by $V_U$ and $V_L$, respectively. The outputs $V_U$ and $V_L$ are then processed, on one hand, by a subtracter 68 to obtain an electrical signal A: $A = \alpha(V_U - V_L)$ wherein $\alpha$ represents amplification factor of a DC amplifier 69, and, on the other hand, by an adder 70 to obtain an electrical signal B; $B = (V_U + V_L)$. The two electrical signals A and B are then processed by a divider 71. The divided value A/B is amplified by a DC amplifier 72. The waveform of a signal thus obtained is shown in FIG. 7, in which an axis of abscissas represents focus displacement and an axis of ordinates represents output (voltage) of the DC amplifier 72. The waveform of A/B is a typical S curve. The output of the DC amplifier 72 is compared with a predetermined value of voltage to detect whether or not the surface of the photosensitive material 53 is located within a depth of focus of the drawing optical system. If the surface of the photosensitive material 53 is not located in the depth of focus, "front focus" or "rear focus" can be also detected by the above mentioned comparison process, which will make an automatic focusing possible.

In FIG. 7, "d" represents a depth of focus and "11" represents a voltage zone corresponding to "d". In order to ensure that the photosensitive material is always located in "d", a dead zone 12 which is slightly smaller than the voltage zone 11 is preferably selected in place of the voltage zone 11 so that even when there are slight errors in measurements or displacement of the lens 3, a precise focusing can be achieved. That is, when the output voltage is within the dead zone 12, the actuator 15 does not operate. On the contrary, when the output voltage is out of the dead zone 12, the actuator 15 operates until the output voltage is within the dead zone 12.

Upper and lower limits of the dead zone 12 are represented by $H_V$ and $L_V$ (FIG. 7) which correspond to threshold values 73H and 73L in FIG. 6. The values 73H and 73L are compared with the output voltage of the DC amplifier 72 to detect not only whether the photosensitive material is located in the depth of focus but also whether the photosensitive material is in "front focus" position or "rear focus" position when the photosensitive material is not located in the depth of focus, by means of AND circuits 75H, 75L and 75M. In case of "front focus" where the output voltage V of the DC amplifier 72 is larger than the upper limit $H_V (V > H_V)$, the AND circuit 75H produces an output signal which is fed to a flip flop 76H, a driver 77H, a motor control circuit 78 and a power amplifier 79, so that the motor 16 rotates to move the lens 3 upward in FIG. 4.

It is necessary to continue moving the lens 3 still after V becomes equal to $H_V (V = H_V)$ and until V becomes equal to $(H_V + L_V)/2$ $(V = (H_V + L_V)/2)$, in order to bring the photosensitive material onto a focal point of the lens 3. For this purpose, the number of pulses corresponding to $\Delta V$ which is represented by the equation; $\Delta V = H_V - (H_V + L_V)/2 = (H_V + L_V)/2$ is pre-memorized in a dead zone adjusting counter 80, so that the motor 16 continues rotating by a value corresponding to the memorized number of pulses after $V = H_V$, to cause a further movement of the lens 3 in the same direction. The movement of the lens 3 is stopped when the motor 16 rotates by the memorized number of pulses after $V = H_V$, so that the photosensitive material is put on the focal point of the drawing optical system.

On the contrary, in case of "rear focus" where V is smaller than $L_V(V<L_V)$, an AND circuit 75L produces an output signal which is fed to a flip flop 76L, a driver 77L, the motor control circuit 78 and the power amplifier 79 so that the motor 16 is reversed to move the lens 3 downward in FIG. 5. The lens 3 moves until the photosensitive material completely comes to the focal point, similarly to the case of "front focus", mentioned above.

An AND circuit 75M generates an output signal when the photosensitive material is located in the depth of focus, i.e., when the output voltage V is within the dead zone 12, so that the motor 16 is not driven. The dead zone 2 can be controlled by modifying the threshold values $H_V$ and $L_V$ and also by changing the number of pulses which is memorized in the dead zone adjusting counter 80, in accordance with the modified threshold values.

Figure 8:
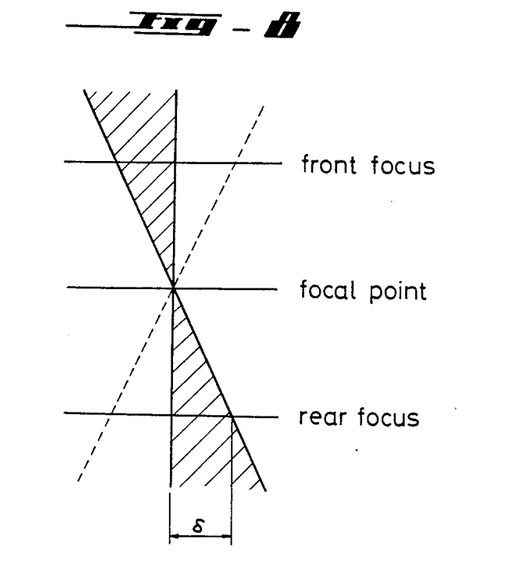
FIG. 8 is a schematic diagram showing an angular speed $\delta$ of the flux of the focus detecting light at locations of a pair of light receiving elements in a focus detecting device.

Between the offset value $\Delta X$(FIG. 4) and the angular spread (FIG. 8) of the flux on the light receiving elements 38U and 38L due to the offset value $\Delta X$, there is a relationship represented by the following equation:

$$\delta = (\Delta X/2F) \cdot (m^2/1-m)$$

wherein "m" designates a magnification of a conjugate optical system consisting of the imaging lens z and the focus detecting collimate lens 35, and "F" a F-number of the imaging lens 3.

The magnification "m" is given by a ratio between a focal length fi of the imaging lens 3 and a focal length fc of the collimate lens 35, that is, $m=(-fc)/fi$. The F-number depends on the resolution limit and on the focal length of the imaging lens system. Since the depth of focus is determined by the F-number, a magnification "m" which gives a maximum angular spread provides an most effective and advantageous optical system.

Figure 9:
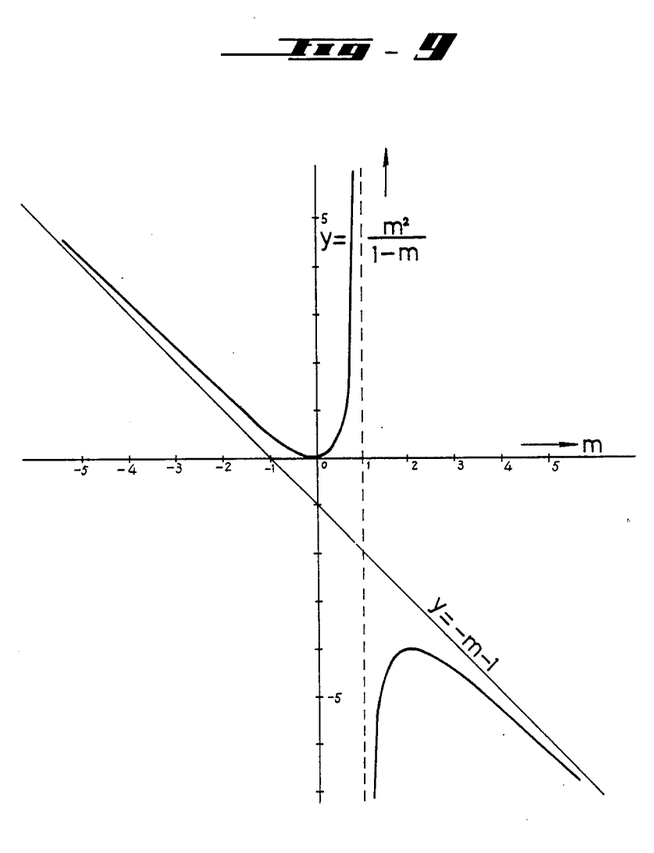
FIG. 9 is a diagram showing $y = m^2/(1-m)$ in which the magnification "m" is variable.

FIG. 9 shows a curve represented by $y=m^2/(1-m)$. As can be seen from FIG. 9, when "$m$"$=+1$ and "$m$"$\to \pm \infty$ (infinite), the ordinate y becomes infinite. It should be noted here that "m" must be negative (m<0) in order to provide a real image. Therefore when "$m$"$\to -\infty$, the best result can be obtained. In the illustrated embodiment, "$m$"$=-10$.

As can be seen from the above discussion, the imaging lens 3 is commonly used not only for the drawing optical system but also for the focus detecting optical system. Attention must be directed to the fact that sensitivity in the focus detecting optical system increases as F-number of the imaging lens decreases, whereas a small F-number makes the depth of focus excessively small, although such a small F-number can increase the resolution in the drawing optical system. Therefore, it is desirable in the focus detecting optical system to use the imaging lens in an open exposure state and in the drawing optical system to use the imaging lens in a slightly diaphragmed position. For this purpose of diaphragming operation, a diaphragm is preferably provided between the collimate lens 2 and the dichroic mirror 31.

Figure 10:
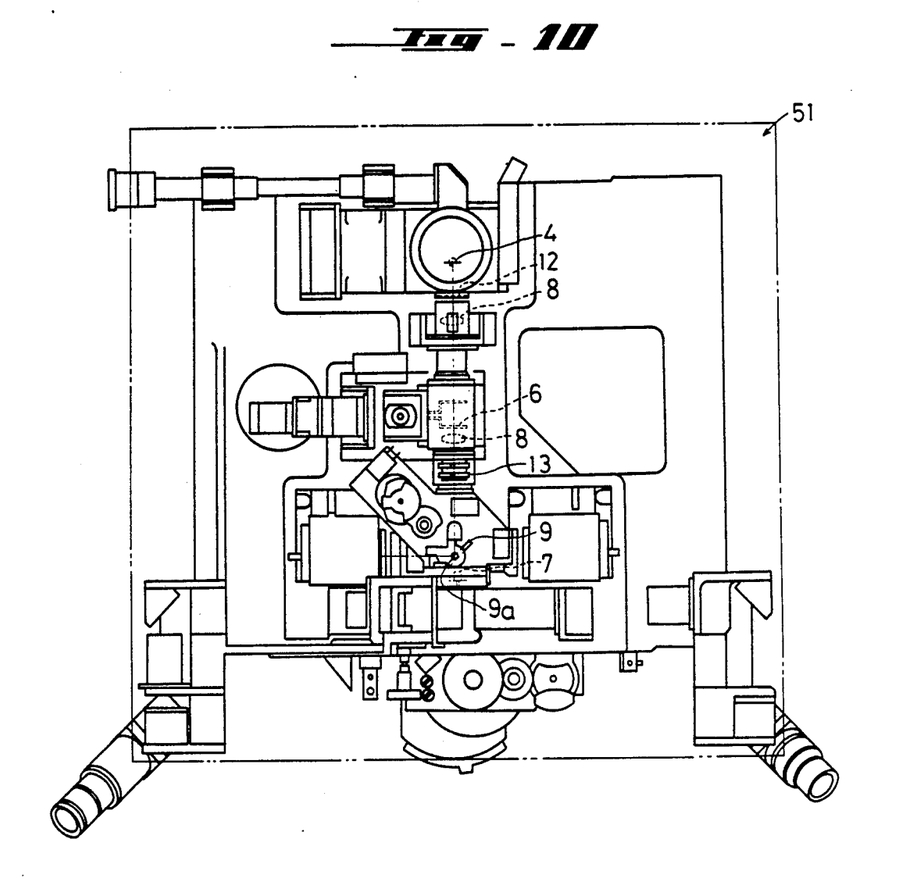
FIGS. 10 and 11 are plan and front elevational views of a photohead in which the optical system shown in FIG. 3 is incorporated; and, FIG. 12 is a conceptual schematic view of another embodiment of an optical system.
Figure 11:
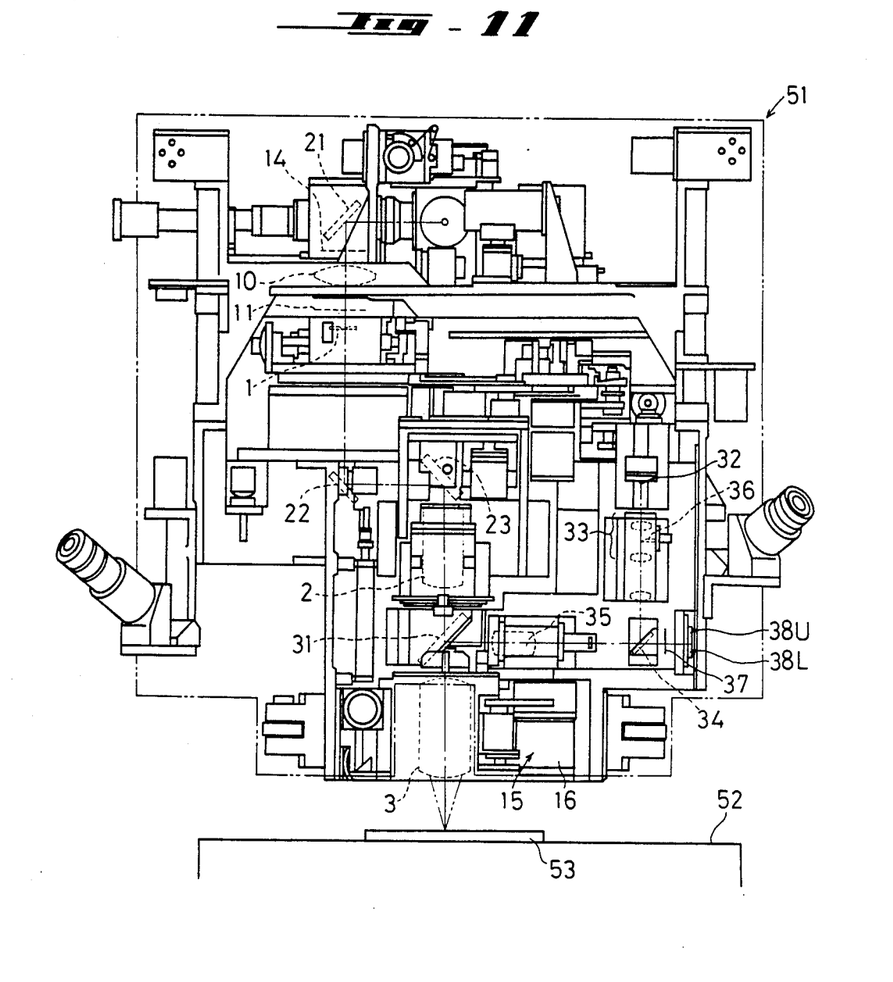

FIGS. 10 and 11 show an optical drawing machine having a photohead 51 in which the optical system of the invention as mentioned above is incorporated. The arrangement of the halogen lamp 4, the filter 12 which partially absorbs and partially reflects infrared light, the first condenser lens 5, the diaphragming shutter 6, the relay condenser lens 8, and the wavelength selecting filter 13 is substantially same as that shown in FIG. 3. The immovable half mirror 9 illustrated in FIG. 3 reflects the illumination flux at right angle in vertically downward directions. However, in FIGS. 10 and 11, the half mirror 9 is rotatable about a pivot pin 9a so as to selectively reflect the flux in the right hand direction or in the left hand direction in FIG. 10. In FIG. 10, the incident flux is reflected at right angle in the left hand direction by the half mirror 9 and is then reflected at right angle in the downward direction by means of an additional mirror 21. The exposure adjusting light receiving element 7 is located behind the half mirror 9 when viewed in the horizontal optical axis to receive a part of the light, i.e., the light passing through the half mirror 9.

The light reflected downward by the additional mirror 21 comes to aperture 1 through the ND filter 14, the second condenser lens 10 and the ND filter 11. The flux which illuminates the aperture 1 is reflected by two mirrors 22 and 23 which are not provided in a conceptual arrangement shown in FIG. 3 and then reaches the collimate lens 2. After that the flux passes through the dichroic mirror 31 and the imaging lens 3 and finally comes to the photosensitive material 53 on the drawing table 52. The imaging lens 3 is moved up and down along the vertical optical axis by means of the actuator 15 having the reversible motor 16.

The focus detecting device 30 includes the LED 32, the condenser lens 33, the knife-edge 36, the half mirror 34, the collimate lens 35, the filter 37 which transmits infrared radiations and absorbs the visible radiations, and a pair of light receiving elements 38U and 38L, in the same arrangement as FIG. 3.

Figure 12:
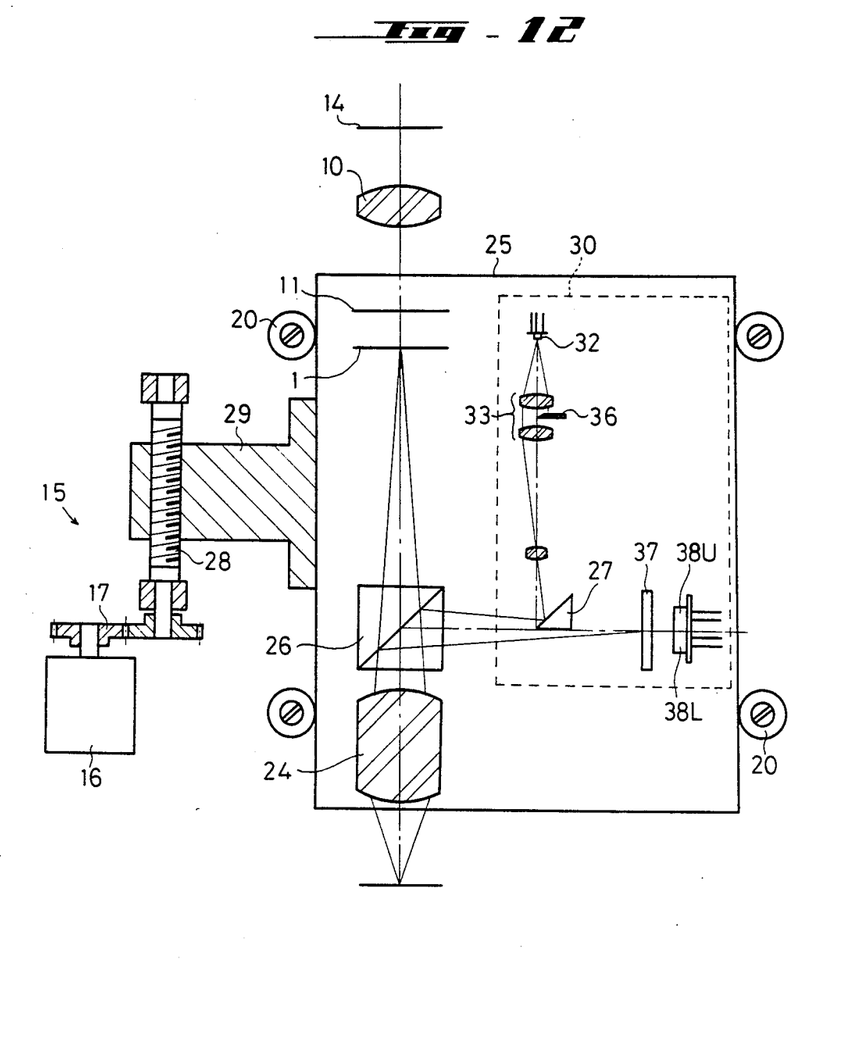

FIG. 12 is a conceptual view of an optical system according to another embodiment of the present invention. In an arrangement shown in FIG. 12, the drawing optical system includes a single imaging lens 24, unlike an embodiment shown in FIG. 3. In FIG. 12, since there is no parallel flux portion, unlike FIG. 3, the imaging lens 24, the aperture 1, and the focus detecting device 30 can be all provided in a common single frame 25 which is movable in directions of an optical axis of the lens 24 along guide rollers 20, by means of the actuator 15. The dichroic mirror in FIG. 3 is replaced by a half prism 26 for providing a clear image, so that the collimate lens 35 in the focus detecting device shown in FIG. 3 can be dispensed with, in FIG. 12. Furthermore, the half mirror 34 in FIG. 3 is replaced by a prism 27 in FIG. 12. The actuator 15 has a screw rod 28 which is screw-engaged in a support 29 of the frame 25 and which can not move in directions of the length thereof but is rotatable by means of the motor 16 through the pinion 17. Parts or components other than the above mentioned elements, shown in FIG. 12 are identical to and operate in the same manner as those in FIG. 3, designated by the same reference numerals.

As can be understood from the above description, according to the present invention, in order to put the photosensitive surface of the photosensitive material within the depth of focus of a drawing optical system in an automatic optical drawing machine, the drawing optical system is displaced along its optical axis in accordance with a distance between the optical system and the photosensitive material, which varies due to uneven surface of the latter and to mechanical errors of the displacement of the drawing table. That is, in the present invention, the attempt has not been directed to an increase of a degree of flatness of the surface of the photosensitive material. Therefore, the present invention can be advantageously used particularly for a large photosensitive material which tends to present a uneven surface or a curved surface.

We claim:

1. An apparatus of automatic focusing in an automatic optical drawing machine comprising a photohead carrying a drawing optical system having an imaging lens assembly, and a drawing table which lies in a plane perpendicular to an optical axis of the drawing optical system and which holds thereon a photosensitive material with a photosensitive surface on which a predetermined pattern of images is to be formed, said drawing table and said photohead being capable of relative two-dimensional movement in a plane parallel to the plane of the drawing table, said optical drawing system including a pair of collimate lens which forms parallel lines of drawing light flux incident of the imaging lens assembly, one of said collimate lenses being also the imaging lens, a stationary dichroic mirror located within said parallel light flux and inclined with respect to the optical axis of the flux, an actuator for moving only said imaging lens in the optical axis, said mirror transmitting drawing light and reflects focus detecting light to which the photosensitive material is insensitive, and a focus detecting device which illuminates and reflects the focus detecting light on the photosensitive surface of the photosensitive material through the dichroic mirror and the imaging lens of the drawing optical system to detect whether the photosensitive surface is located in the depth of focus of the drawing optical system in accordance with the reflecting light, said focus detecting device being adapted to produce and give a drive signal to said actuator so as to continuously maintain the photosensitive surface of the photosensitive material within the depth of focus of the drawing optical system.

2. An apparatus according to claim 1, wherein said focus detecting device comprises a diode which emits infrared light, a condenser lens assembly which collects the light from the infrared light emitting diode, a knife edge which obstructs the light flux passing through the condenser lens assembly to remove half of the light flux with respect to the optical axis so that a generally semi-circular flux is provided, a half mirror which reflects the generally semi-circular flux of focus detecting light onto the dichroic mirror and which transmits the generally semi-circular flux of focus detecting light which is reflected on the photosensitive surface of the photosensitive material and then on the dichroic mirror, and a pair of light receiving elements which are located in a conjugate image surface to a complete focal position of the photosensitive material to receive the generally semi-circular flux of reflecting light which has passed through the half mirror, said light receiving elements being adapted to produce and give drive signals to said actuator, in accordance with differences in the amount of light received by the light receiving elements.

3. An apparatus according to claim 1, further comprising a dichroic mirror in the form of a plane mirror arranged between the imaging lens assembly and the collimate lens assembly, so that the plane mirror can be located in the parallel flux between the imaging lens assembly and the collimate lens assembly.

* * * * *

UNITED STATES PATENT AND TRADEMARK OFFICE
CERTIFICATE OF CORRECTION

PATENT NO. : 4,512,642

DATED : 23 April 1985

INVENTOR(S) : Tokuhisa Ito, Izumi Kurata and Takashi Okuyama

It is certified that error appears in the above-identified patent and that said Letters Patent is hereby corrected as shown below:

On the first page, the assignee "Ashai" should be --Asahi--;

Column 1, lines 7, 11, 12, 49, 59 and 60, "photosensive" should be --photosensitive--;

Column 1, line 12, "sensive" should be --sensitive--;

Column 1, line 51, "two-dimentional" should be --two-dimensional--;

Column 2, line 41, "two-dimentional" should be --two-dimensional--;

Column 3, line 37, "designate" should be --designates--;

UNITED STATES PATENT AND TRADEMARK OFFICE
CERTIFICATE OF CORRECTION

PATENT NO. : 4,512,642

DATED : 23 April 1985

INVENTOR(S) : Tokuhisa Ito, Izumi Kurata and Takashi Okuyama

It is certified that error appears in the above-identified patent and that said Letters Patent is hereby corrected as shown below:

Column 3, line 49, delete "imaging lens 3" and insert --drawing optical means--;

Column 3, line 49, "Further more" should be --Furthermore--;

Column 4, line 27, "an" should be --a--;

Column 5, line 65, "Amplittudes" should be --Amplitudes--;

Column 7, line 14, "dead zone 2" should be --dead zone 12--;

Column 7, line 37, "an" should be --a--;

Column 9, line 1, "a" should be --an--.

Signed and Sealed this

Nineteenth Day of November 1985

[SEAL]

Attest:

DONALD J. QUIGG

Attesting Officer

Commissioner of Patents and Trademarks